United States Patent [19]
Neudeck et al.

[11] Patent Number: 5,286,996
[45] Date of Patent: Feb. 15, 1994

[54] TRIPLE SELF-ALIGNED BIPOLAR JUNCTION TRANSISTOR

[75] Inventors: Gerold W. Neudeck, West Lafayette, Ind.; Rashid Bashir, Lubbock, Tex.

[73] Assignee: Purdue Research Foundation, Hovde Hall, Ind.

[21] Appl. No.: 815,708

[22] Filed: Dec. 31, 1991

[51] Int. Cl.$^5$ ............... H01L 29/73; H01L 29/04
[52] U.S. Cl. .................... 257/586; 257/565; 257/588
[58] Field of Search ........... 257/586, 587, 588, 552, 257/554, 565

[56] References Cited

U.S. PATENT DOCUMENTS

| | | | |
|---|---|---|---|
| 4,101,350 | 7/1978 | Possley et al. | 148/175 |
| 4,504,332 | 3/1985 | Shinada | 148/187 |
| 4,531,282 | 7/1985 | Sakai et al. | 29/578 |
| 4,641,416 | 2/1987 | Iranmanesh et al. | 29/576 |
| 4,829,016 | 5/1989 | Neudeck | 437/31 |
| 4,830,972 | 5/1989 | Hamasaki | 437/31 |
| 4,849,371 | 7/1989 | Hansen et al. | 437/82 |
| 4,851,362 | 7/1989 | Suzuki | 437/31 |
| 4,900,689 | 2/1990 | Bajor et al. | 437/31 |
| 4,927,774 | 5/1990 | Welbourn et al. | 437/31 |
| 4,988,632 | 1/1991 | Pfiester | 437/31 |
| 4,997,775 | 3/1991 | Cook et al. | 437/31 |
| 5,017,990 | 5/1991 | Chen et al. | 257/586 |
| 5,026,654 | 6/1991 | Tanba et al. | 437/31 |

FOREIGN PATENT DOCUMENTS

| | | |
|---|---|---|
| 0083063 | 7/1981 | Japan . |
| 001934 | 1/1990 | Japan . |
| 001936 | 1/1990 | Japan . |
| 0058335 | 2/1990 | Japan . |
| 0151037 | 6/1990 | Japan . |

OTHER PUBLICATIONS

D. D. Tang, et al., "A Symmetrical Bipolar Structure", 1980 IDEM, Digest of Technical Papers, pp. 58–60.
T. Chen, et al., "A Submicrometer High-Performance Bipolar Technology", IEEE Electron Device Letters, vol. 10, No. 8, pp. 364–366, Aug. 1989.
T. Sakai, et al., "High Speed Bipolar ICs Using Super Self-Aligned Process Technology," Japanese Journal of Applied Physics, vol. 20, Supp. 20-1, pp. 155–159, 1981.
S. Konaka, et al., "A 30-ps Si Bipolar IC Using Super Self-Aligned Process Technology", IEEE Transactions on Electron Devices, vol. ED-33, No. 4, pp. 526–531, Apr. 1986.
Y. Yamamoto, et al., "SDX: A Novel Self-Aligned Technique and Its Application to High-Speed Bipolar LSI's", IEEE Transactions on Electron Devices, vol. ED-35, No. 10, pp. 1601–1608, Oct. 1988.
K. Washio, et al., "Fabrication Process and Device Characteristics of Sidewall Base Contact Structure (List continued on next page.)

*Primary Examiner*—Rolf Hille
*Assistant Examiner*—David B. Hardy
*Attorney, Agent, or Firm*—Bell, Seltzer, Park & Gibson

[57] ABSTRACT

A self-aligned process for fabricating high performance bipolar transistors for integrated circuits includes the formation of a collector contact and intrinsic collector region within an opening at the face of a semiconductor substrate. In particular, layers of oxide and polysilicon are formed on the surface of a substrate. An opening is then formed in both layers followed by the implantation of a buried collector region into the substrate at the exposed substrate face through the opening. Polysilicon contacts to the buried layer are then formed on the sidewalls of the opening. These contacts join with the polysilicon layer to form a collector contact. An oxide is then grown on the collector contact. A monocrystalline intrinsic collector is then formed from the exposed substrate face adjacent said collector contact. In this manner, the buried collector, collector contact and intrinsic collector are all formed in a self-aligned manner. Emitter and base regions may then be formed in the intrinsic collector, using techniques to form a completely self-aligned device.

10 Claims, 5 Drawing Sheets

OTHER PUBLICATIONS

Transistor Using Two-Step Oxidation of Sidewall Surfaces", IEEE Transactions on Electron Devices, vol. ED-35, No. 10, pp. 1596-1599, Oct. 1988.

S. Konaka, "A 20-ps Si Bipolar IC Using Self-Aligned Process Technology with Collector Ion Implantation", IEEE Transactions on Electron Devices, vol. ED-36, No. 7, pp. 1370-1375, Jul. 1989.

J. Glenn, et al., "High-Speed Fully Self-Aligned Single-Crystal Contacted Silicon Bipolar Transistor", Electronics Letters, vol. 26, No. 20, pp. 1677-1678, Sep. 27, 1990.

C. Subramanian and G. W. Neudeck, "A Full-Wafer SOI Process for 3-Dimensional Integration", 9th Biennial University/Government Industry Microelectronics Symposium, Melbourne Fla., pp. 195-198, Jun. 12-14, 1991.

TRIPLE SELF-ALIGNED BIPOLAR JUNCTION TRANSISTOR

FIELD OF THE INVENTION

This invention relates to bipolar junction transistors for large scale integration, and more particularly to a high performance bipolar transistor structure having self-aligned active regions and low parasitic capacitance, and methods for fabricating the same.

BACKGROUND OF THE INVENTION

As state-of-the-art computer systems and circuits evolve, there is a continuing need for higher performance bipolar junction transistors capable of operating at higher switching speeds, with increasing degrees of device integration, and with a low rate of failure. There is also a continuing need to shrink or scale down device size to obtain improved device performance. In order to obtain further advances in device scaling, improved lithographic techniques and equipment must be developed. Unfortunately, the lithographic patterning tolerances of state-of-the-art equipment are rapidly reaching their limits. The range of future device geometries and contact line widths require extremely small dimensions. Thus, lithographic errors within the normal tolerance range can impede efforts to further shrink device size. Accordingly, it would be advantageous to develop a process and device geometry less dependent on photolithographic accuracy.

Reduced geometry devices can be fabricated using "self-aligned" process techniques. In a self-aligned process, at least one device region is used as an alignment guide for forming a subsequent region(s). Accordingly, self-aligned fabrication processes are less dependent upon precise photolithographic alignment than similarly directed non self-aligned processes.

Examples of bipolar transistors formed having one or more self-aligned active regions, and requiring one or more critical alignment steps, can be found in U.S. Pat. No. 4,101,350 to Possley, et al. entitled *Self-Aligned Epitaxial Method for the Fabrication of Semiconductor Devices;* in U.S. Pat. No. 4,531,282 to Sakai, et al. entitled *Bipolar Transistor Having Vertically Arrayed Collector-Base-Emitter with Novel Polycrystalline Base Electrode Surrounding Island Emitter and Method of Making the Same;* in a publication entitled *A 20ps Si Bipolar IC Using Advance Super Self-Aligned Process Technology with Collector Ion Implantation* by Konaka, et. al. published in the IEEE Transactions on Electron Devices, Vol. 36, No. 7, pp. 1370–1375, July, 1989; in a publication entitled *SDX: A Novel Self-Aligned Technique and its Application to High Speed Bipolar LSI's* by Yamamoto, et al. published in the IEEE Transactions on Electron Devices, Vol. 35 No. 10, pp. 1601–1608, October, 1988; and in a publication entitled *A submicrometer High-Performance Bipolar Technology.*, by Chen, et al. published in the IEEE Electron Device Letters, Vol. 10, No. 8, pp. 364–366, August, 1989.

Many other examples of bipolar transistors formed using self-alignment steps can also be found. For example, U.S. Pat. No. 4,927,774 to Welbourn, et al. entitled *Self-Aligned Bipolar Fabrication Process*, discloses a self-aligned process for forming a walled-emitter transistor.

As is well known to those skilled in the art of integrated circuit design, faster switching speeds can be obtained, in part, by reducing the lateral and vertical size and parasitic components of individual transistors and increasing the degree of integration. Typical parasitics include base resistance, $r_b$, base-collector capacitance, $C_{bc}$, collector resistance, $r_c$, and collector-substrate capacitance, $C_{cs}$. As these parasitic components are reduced, device performance improves because faster device operation and lower power consumption is possible.

Attempts have been made at forming bipolar transistors with reduced base and collector resistance ($r_b$, $r_c$) and base-collector capacitance ($c_{bc}$), using self-alignment techniques. For example, U.S. Pat. No. 4,504,332 to Shinada entitled *Method of Making a Bipolar Transistor*, disclosed a partially self-aligned bipolar transistor having a laterally displaced collector contact electrically connected to an embedded extrinsic collector layer. Not all active regions are self-aligned, however, and the ability to obtain reduced collector-substrate capacitance is limited by at least the width of the embedded extrinsic collector layer.

In summary, the art has yet to produce a completely self-aligned bipolar junction transistor with reduced collector-substrate capacitance.

SUMMARY OF THE INVENTION

It is therefore an object of the present invention to provide an improved bipolar transistor structure and method for fabricating the same.

It is another object of the present invention to provide a bipolar transistor with low parasitic resistance ($r_b$, $r_c$) and parasitic capacitance ($C_{bc}$ and $C_{cs}$).

It is still another object of the present invention to provide a bipolar transistor wherein the device active regions are self-aligned to the buried collector and to a buried collector contact.

These and other objects are provided according to the present invention by a bipolar transistor having self-aligned active regions including an intrinsic collector region self-aligned to a buried collector and to buried collector contacts, thus eliminating the need for a laterally offset collector contact and reducing the reliance on photolithographic accuracy at various process steps. In particular, the self-aligned bipolar transistor of the present invention includes a buried collector region formed in a semiconductor substrate at an opening in a first insulating layer. A collector contact layer is then formed on the walls of the opening, making electrical contact with at least a portion of the buried collector region. Critical photolithographic alignment is not required to form this collector contact layer. An intrinsic collector region is also formed on the buried collector in the opening. Base and emitter regions and contacts can then be formed in the intrinsic collector using known techniques.

The structure of the present invention provides a laterally compact bipolar transistor with reduced buried collector area, reduced collector-substrate capacitance, reduced collector resistance and improved performance. Moreover, the device characteristics of the present invention are generally immune from photolithopgraphic errors that occur during fabrication.

According to another aspect of the present invention, a triple self-aligned structure can be formed. Stated alternatively, a bipolar transistor can be fabricated wherein all active regions, including the collector contacts, can be self-aligned to the buried collector region. In particular, the triple self-aligned bipolar transistor of the present invention can be formed using the intrinsic collector region as a starting point. Low resistance extrinsic base contact regions can be formed by selective epitaxial growth (SEG) of a monocrystalline semiconductor region from the intrinsic collector and suitable doping of this region. Since the extrinsic base contacts are formed in regions grown from the intrinsic collector, the central portion of the intrinsic collector remains for the formation of the intrinsic base and emitter therein in a self-aligned manner. Accordingly, all active regions are formed in self-aligned manner using only a single mask to define the opening through which the buried collector is formed.

In particular, according to one embodiment of the present invention, the bipolar transistor is formed by growing a field insulation on the surface of a semiconductor substrate. The substrate may be, for example, a conventional substrate, a monocrystalline tub in a substrate, or an epitaxial layer formed on a semiconductor substrate using any one of a number of conventional techniques. The thickness of the field insulation is suitably chosen to control the distance between the base-intrinsic collector and intrinsic collector-buried collector regions. A first polycrystalline silicon film is then deposited and can be doped in-situ or by implantation. An opening is then formed in the first polycrystalline silicon layer and field insulation to expose a portion of the underlying substrate.

A buried collector is then formed in the substrate at the opening, with the size of the opening controlling the width of the buried collector and the size of the parasitic collector-substrate capacitance. Although a single masking step is used to define the opening which subsequently aligns the rest of the active regions, it requires non-critical alignment. A second polycrystalline silicon layer is then deposited to cover the sidewall of the opening and make contact with at least a portion of the buried collector. Etching, preferably reactive ion-etching (RIE), is then used to etch the second polycrystalline silicon layer and form a conductive collector contact. After an insulating layer is grown, anisotropic RIE is used to expose the buried collector region in the opening. The intrinsic collector layer region is then formed in the opening on top of the exposed buried collector region. If desired, known processing can be used to form base and emitter regions in the intrinsic collector to form a bipolar junction transistor.

Accordingly, the process of the present invention forms a bipolar junction transistor that is completely self-aligned to a buried collector layer. Also, the buried collector is aligned using a non-critical alignment step. This process therefore produces a bipolar transistor with reduced collector resistance, reduced collector-substrate capacitance, and controllable device characteristics. As should be well-known to those skilled in the art, a P-N-P bipolar junction transistor could be formed in a similar fashion.

DESCRIPTION OF THE PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete and will fully convey the scope of the invention to those skilled in the art.

Figure 1A:
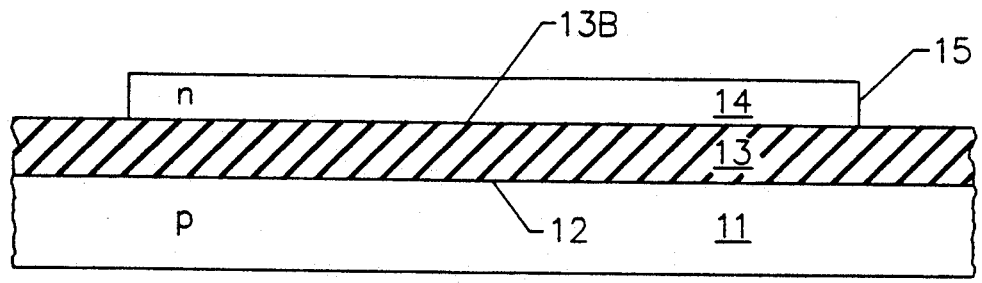
FIGS. 1A-1J illustrate a method of forming a self-aligned buried collector region, collector contact and intrinsic collector for a bipolar transistor according to the present invention.

Referring to FIGS. 1A-1J, a method for forming a self-aligned buried collector, collector contact and intrinsic collector according to the present invention will now be described. As shown in FIG. 1A, the process begins with a P-doped silicon substrate 11 having a horizontal face 12. Next, an oxidation step is performed to grow a first insulating layer 13, typically an oxide, on top of the substrate. The thickness of this insulating layer will partially determine the vertical distance between the base/collector and collector/buried collector junctions, as described more fully hereinbelow.

Then a polycrystalline silicon layer 14 having a thickness of about 0.7 $\mu$m is deposited on top of the first insulating layer 13 at top surface 13B. The polycrystalline silicon layer 14 is doped with arsenic, for example, using conventional in-situ or implantation techniques. Layer 14 can be deposited using conventional Low Pressure Chemical Vapor Deposition (LPCVD) techniques. For example a $SiH_4$ vapor is preferred. Using known photoresist techniques, layer 14 can be defined an Reactive-Ion Etched (RIE), yielding vertical edges 15.

Conventional trench isolation, not shown, can be used to further electrically insulate adjacent structures if desired. However, according to the invention, trench isolation is unnecessary because the orientation of the self-aligned collector contacts, as set forth below, enhances the self-isolating characteristics of the bipolar transistor. Accordingly, an isolation region need not be formed in the semiconductor substrate between the bipolar transistor and adjacent devices.

Figure 1B:
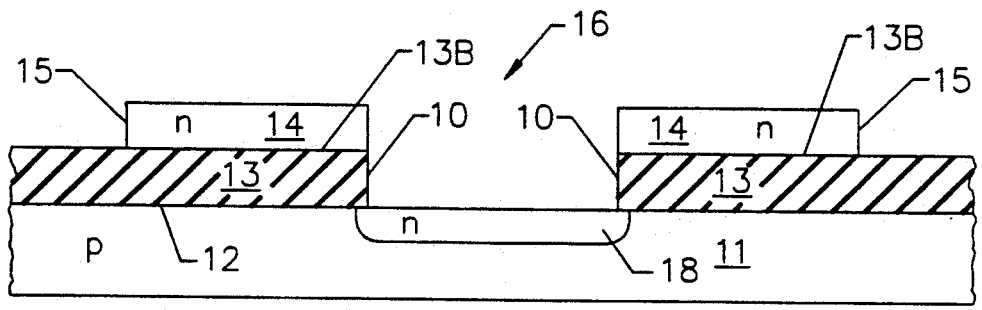

Referring now to FIG. 1B, a photoresist masking step requiring non-critical alignment is used to form an opening 16, exposing a portion of the substrate 11 at face 12 and defining a first sidewall 10. This masking step effectively defines an opening to which all subsequently formed active regions and extrinsic device regions are self-aligned. As will be understood by one skilled in the art, this step requires non-critical photolithographic alignment because the opening can be formed anywhere within layer 14 as defined by edges 15. A RIE step can be used to anisotropically etch through layers 13 and 14. Once the opening 16 has been defined, an n-type impurity, preferably arsenic, can be implanted into the substrate using the same photoresist mask as used to define the opening. This implantation step forms the buried collector region 18.

Figure 1C:
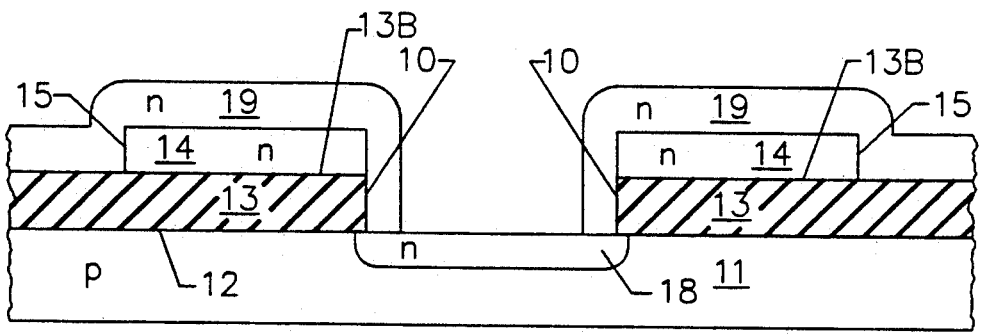

Referring now to FIG. 1C, another LPCVD polycrystalline silicon layer 19 can be deposited conformally on polycrystalline silicon layer 14 and on sidewall 10, and in-situ doped in an $AsH_3$ ambient.

Figure 1D:
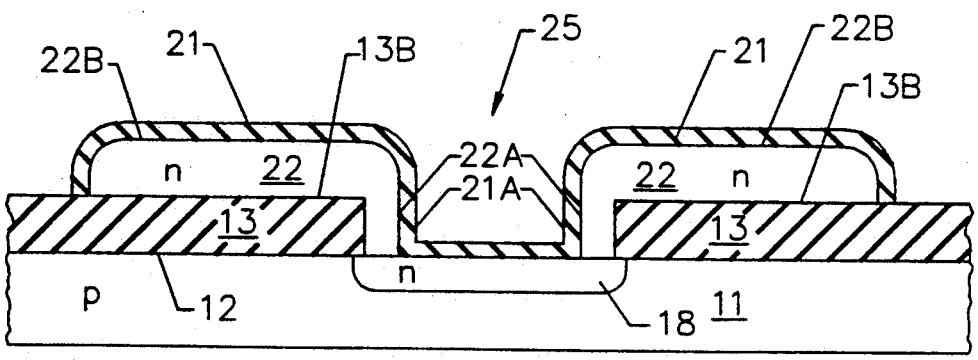

As shown in FIG. 1D, the polysilicon layer 19 is anisotropically etched using RIE to form the conductive collector contact 22 having a second sidewall 22A and a top surface 22B. Next, a thin oxide 21, approximately 0.1 $\mu$m, having a third sidewall 21A is formed over the conductive collector contact 22 and the buried collector region 18 in opening 25.

Figure 1E:
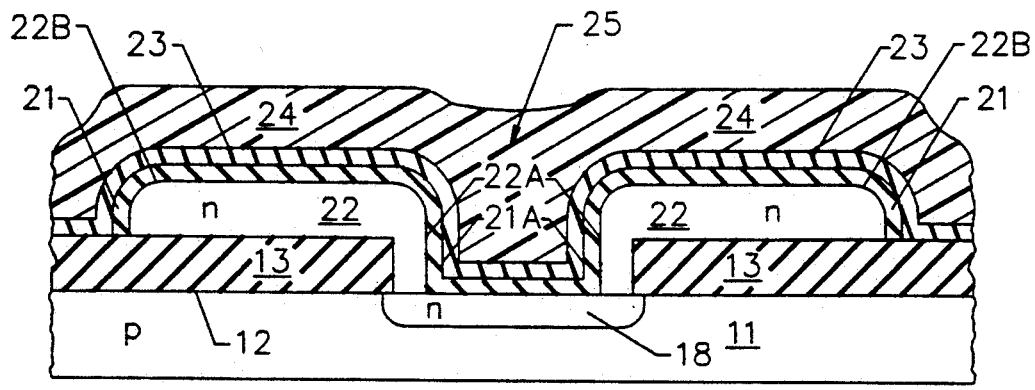
Figure 1F:
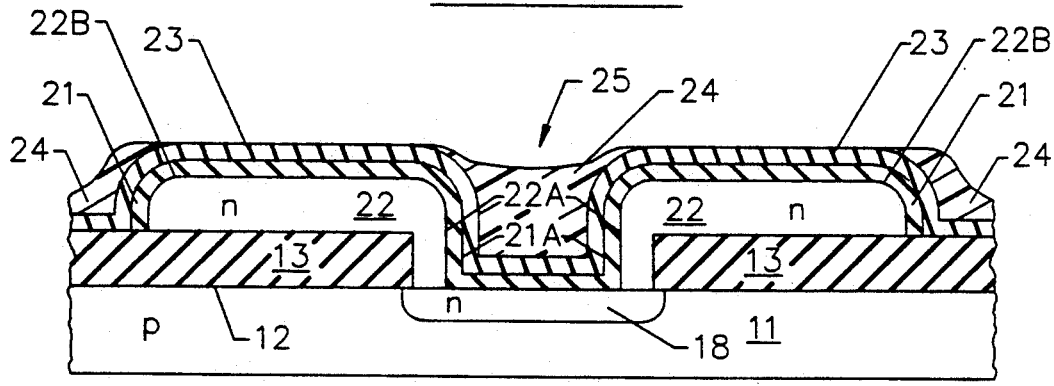
Figure 1G:
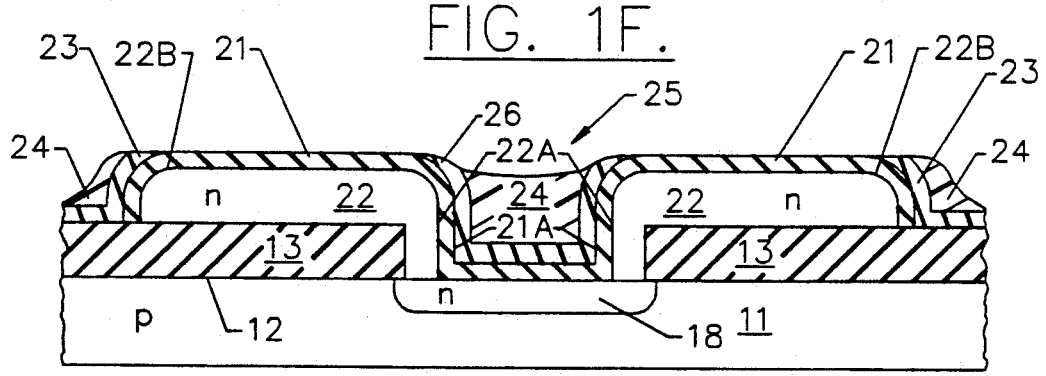

Referring to FIG. 1E, a $Si_3N_4$ (silicon nitride) layer 23 is deposited over the entire substrate using, for example, a chemical vapor deposition (CVD) technique. This step is followed by a deposition of planarization resist 24. The planarization resist 24 fills opening 25. Conventional RIE techniques can then be used to etch-back the planarization resist to expose the top surface of nitride layer 23 of shown in FIG. 1F. The remaining resist in opening 25 is then used as a mask in removing the exposed nitride by a selective RIE technique, as shown in FIG. 1G.

Figure 1H:
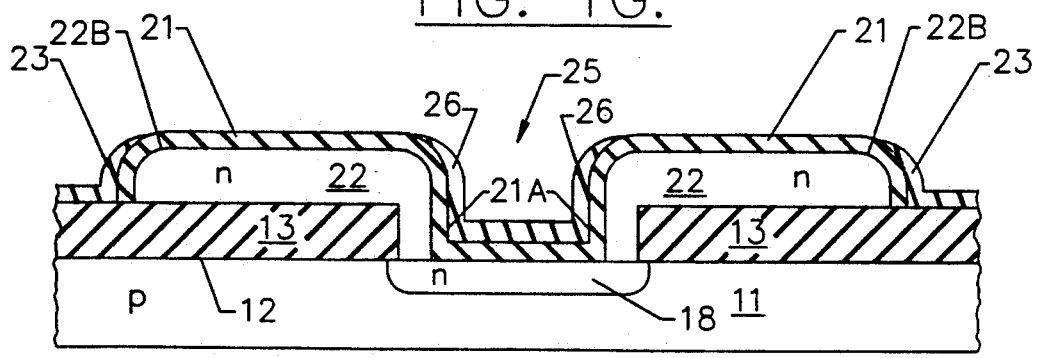

The planarization resist 24 in the opening is then removed, leaving the sidewall nitride 26 on the third sidewall 21A and on top of the portion of oxide layer 21 contacting the buried collector region 18, as shown in FIG. 1H.

Figure 1I:
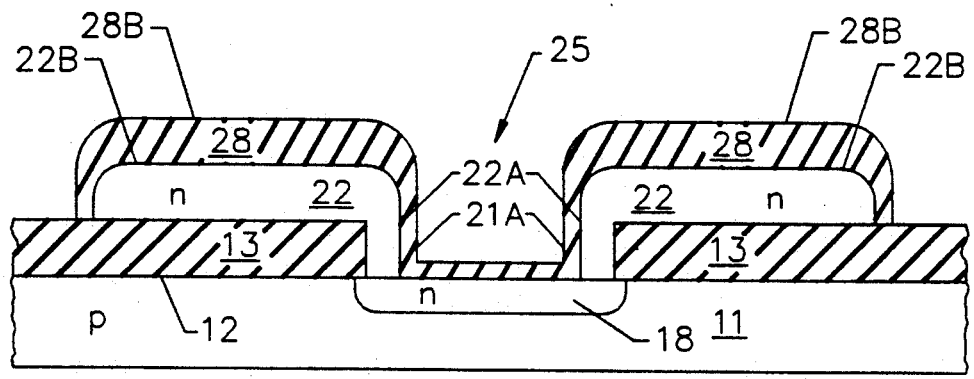

Referring now to FIG. 1I, conventional selective oxidation techniques using the sidewall nitride 26 as a mask can be used to grow a relatively thick oxide (approximately 0.55 $\mu$m) from oxide layer 21 to form a second insulating layer 28, having a third sidewall 21A and a top surface 28B. the thickness of layer 28 will control the extrinsic base-collector capacitance. Sidewall nitride 26 is then completely removed as shown in FIG. 1I.

Figure 1J:
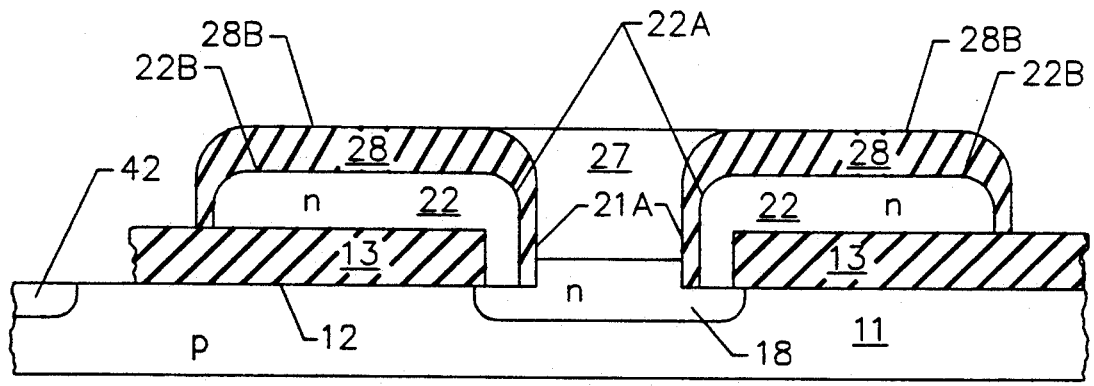

As shown in FIG. 1J, maskless anisotropic RIE can be used to etch the thin oxide at the bottom of opening 25, leaving oxide 28 on sidewall 22A and top surface 22B. This step opens a seed hole and exposes a portion of the buried collector region 18 at face 12. From this seed hole, a monocrystalline region 27 can be grown epitaxially in opening 25 along third sidewall 21A. Preferably, selective epitaxial growth (SEG) is carried out in a $SiH_2Cl_2$—$H_2$—HCl ambient or other suitable selective method. Finally, the structure is planarized back to top surface 28B. One possible technique would be chemical-mechanical polishing using top surface 28B as an etch-stop. As described below, the monocrystalline region can be used as an intrinsic collector for a bipolar junction transistor.

It will be understood by those having skill in the art that significant reductions in collector-substrate capacitance can be achieved using the structure shown in FIG. 1J as a staring point for forming bipolar junction transistors. Furthermore, since the buried collector region 18, conductive collector contact layer 22 and monocrystalline region 27 are all self-aligned to the opening 16 shown in FIG. 1B, the methods according to the present invention are less dependent on photolithographic accuracy. As compared to conventional collector contacting schemes, no n+ sinker implants or diffusions are required.

Trench isolation should not be required between the buried collector region and adjacent device 42 as shown in FIG. 1J because the self-aligned placement of the conductive collector contact 22 reduces the likelihood that stray leakage currents will flow in the substrate 11. In contrast, trench isolation would be required if the collector contact was not self-aligned. For example, a recent publication by Chen, et al. entitled *A submicrometer High-Performance Bipolar Technology*, in IEEE Electron Device Letters, Vol. 10, No. 8, p. 364-366, August, 1989, discloses the presence of trench isolation in a device with laterally displaced collector contacts.

In another embodiment of the present invention for creating the structure shown in FIG. 1J, the planarization resist deposition step is substituted with a polycrystalline silicon deposition step. In this embodiment, layer 24, shown in FIG. 1E, is polycrystalline silicon. The subsequent steps corresponding to FIGS. 1E-1H are essentially identical with polycrystalline silicon being substituted for the planarization resist. However, in this embodiment, a conventional chemical-mechanical planarization step can be substituted for the RIE step corresponding to FIG. 1F, if the width of opening 25 is more than twice as great as the layer 24 thickness.

Referring to FIGS. 2A-2F, a method of forming a completely self-aligned bipolar transistor from the structure of FIG. 1J will now be described. It will be understood by those having skill in the art that other methods for forming base and emitter regions in the structure shown in FIG. 1J may be used. For example, the double self-aligned method described in a publication entitled *Fabrication Process and Device Characteristics of Sidewall Base Contact Structure Transistor Using Two-Step Oxidation of Sidewall Surface*, by Washio, et al., published in IEEE Transactions of Electron Devices, Vol. 35, No. 10, pp. 1596-1600, October, 1988, could be used to form a base and emitter from the self-aligned intrinsic collector and buried collector regions as depicted in FIG. 1J.

Figure 2A:
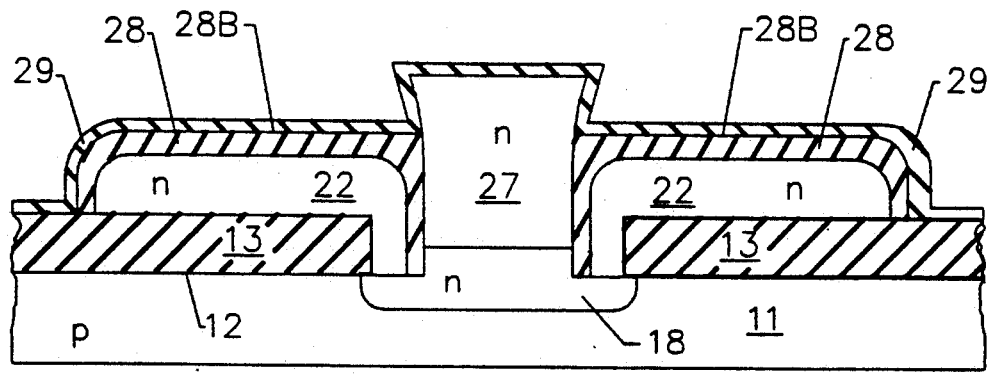
FIGS. 2A-2F illustrate a method of forming a self-aligned base, base contact, and emitter for the structure of FIG. 1J, according to the present invention.

Starting with the structure shown in FIG. 1J and referring to FIG. 2A, a wet etch is used to remove a portion of the second insulating layer 28 at the top surface 28B. Next, a thin stress relief oxide is grown (not shown) followed by a CVD deposit of nitride 29.

Figure 2B:
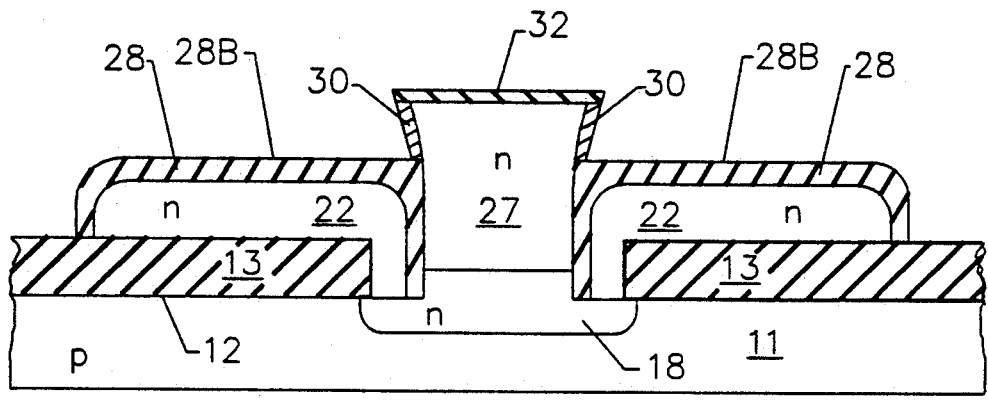
Figure 2C:
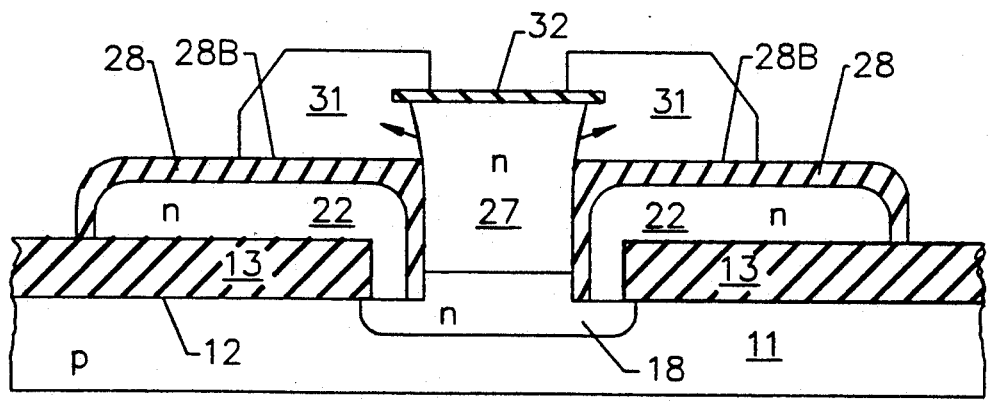

Now referring to FIG. 2B, an anisotropic RIE can be performed to remove the nitride leaving only nitride sidewall spacers 30 on the sidewalls of the monocrystalline region 27. The top of region 27 is then selectively oxidized to form an oxide cap 32. Now referring to FIG. 2C, the sidewall spacers 30 are removed to form seed holes. Monocrystalline silicon 31 is then grown laterally along the top surface 28B using SEG, in the direction indicated by the arrows. For example, an article entitled *A Full-Wafer SOI Process for 3 Dimensional Integration*, published at the 9th Biennial University/Government/Industry Microelectronics Symposium, Melbourne, Fl. pp. 195-198, Jun. 12-14 1991, and written by Subramanian and coinventor Neudeck, discloses a process for performing epitaxial lateral overgrowth from a vertical seedhole that is compatible with the methods herein described.

Figure 2D:
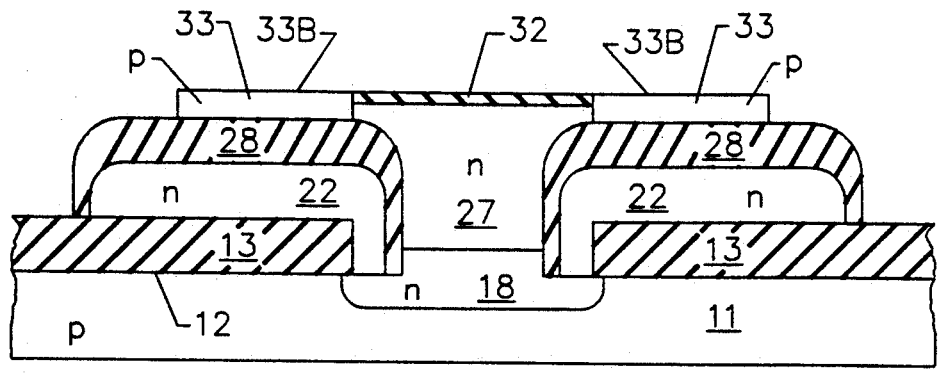

Referring to FIG. 2D, the overgrown silicon 31 is planarized, using chemical-mechanical polishing, down to the oxide cap 32. It is understood that before planarization, Plasma-Enhanced Chemical Vapor Deposition (PECVD) of nitride may also be used to form a local area etch-stop. A maskless boron implant is then performed to form the base contact layer 33 (extrinsic base p+ region) having a top surface 33B. It will be understood by those having skill in the art that the oxide cap 32 will act as a mask over the monocrystalline region 27 during the boron implantation step.

Figure 2E:
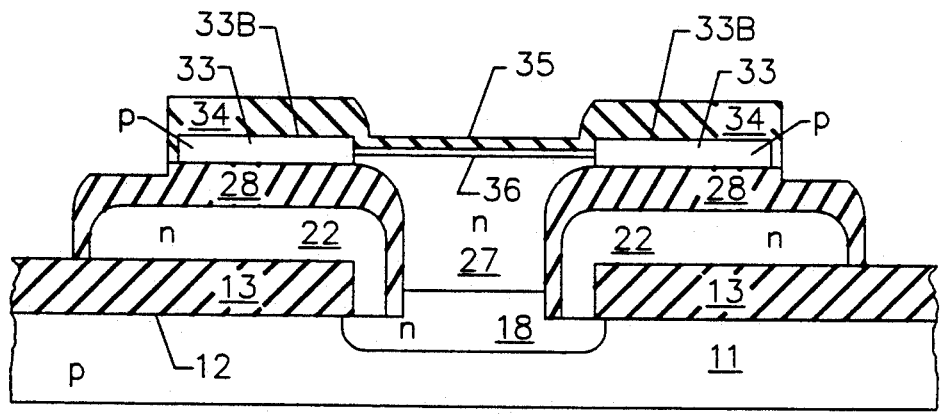

Now referring to FIG. 2E, the oxide cap 32 shown in FIG. 2D and portions of the second insulating layer 28, extending beyond the ends of the base contact layer 33, are removed using conventional etching techniques. Next, a low temperature boron-enhanced oxidation step is performed to grow a thicker oxide layer 34 over the base contact layer 33 than over the monocrystalline region 27. The base impurity can then be implanted through 34 at 35. This results in a shallow junction 36.

Figure 2F:
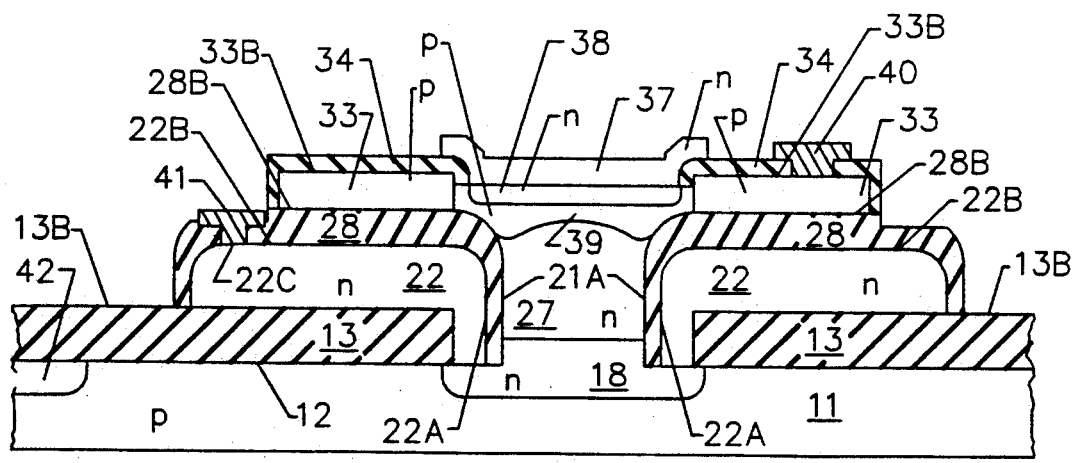

The final structure, shown in FIG. 2F, can be obtained by first removing the oxide layer 34 at 35 using RIE, for example. Next, a conventional arsenic doped polysilicon layer can be deposited and defined to form an emitter 37 which is self-aligned to the intrinsic base. An anneal is then performed to activate and drive-in the impurities for the intrinsic base region 39 and emitter region 38 and to obtain the desired junction depths. Finally, a base contact 40 at surface 33B and collector contact 41 in the second opening 22C, are formed and metallized.

Accordingly, the completely self-aligned bipolar transistor according to the present invention comprises a substrate 11 having a face 12; a first insulating layer 13 having top surface 13B; a buried collector region 18; a conductive collector contact layer 22 having a second sidewall 22A, top surface 22B and opening 22C; a second insulating layer 28 having a third sidewall 21A and top surface 28B; a monocrystalline region 27 forming an intrinsic collector; a base contact layer 33 forming the extrinsic base and having a top surface 33B; an intrinsic base region 39; an emitter 37 and emitter region 38; a base contact 40; and collector contact 41. As described above, the structure need not be separated from an adjacent device 42 by an isolation region such as a trench.

As will be understood by one skilled in the art, the self-aligned emitter can also be formed by an n+ implantation into the portion of monocrystalline region 27 exposed by the removal of oxide layer 34 at 35. Then, after an appropriate anneal to drive-in the base and emitter impurities, a metal layer can be deposited and patterned to form the emitter contact. Using this technique, the emitter and emitter contact would be shown by regions 37 and 38, respectively, as depicted in FIG. 2F.

Alteratively, an n+ arsenic doped polycrystalline emitter can be deposited after the anneal step and after oxide layer 34 at 35 is removed. Following this, a suitable metal can be deposited and patterned to form the emitter contact. Referring to FIG. 2F, the region 38 would no longer be present and region 37 would represent the n+ emitter. The metal contact, not shown, would contact emitter 37 on top. Other steps for forming the emitter, such as by selectively growing a single crystal emitter from the region exposed by the removal of oxide layer 34 at 35, could also be incorporated into the methods for forming a completely self-aligned transistor, as described herein.

The methods according to the present invention produce a device with improved performance, reduced parasitics and significantly reduced collector-substrate capacitance. Moreover, the bipolar transistor fabricated according to the completely self-aligned method described above is almost completely immune from photolithographic alignment errors. This is because all device active regions are self-aligned to a first non-critical masking step. In addition, the structure shown in FIG. 1J is compatible with conventional techniques for producing single and double self-aligned emitter and base regions from an already formed collector.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A bipolar transistor comprising:
    a semiconductor substrate;
    a buried collector region of first conductivity type in said substrate at a face thereof;
    a first insulating layer on said substrate, at said face, said first insulating layer having a top surface opposite said substrate and an opening therethrough, for exposing said buried collector region and defining a first sidewall in said first insulating layer;
    a conductive collector contact layer of said first conductivity type, having a top surface opposite the top surface of said first insulating layer, on said first sidewall and defining a second sidewall, said conductive collector contact layer electrically contacting said buried collector region and extending from said first sidewall onto the top surface of said first insulating layer;
    a second insulating layer on said second sidewall and defining a third sidewall, said second insulating layer contacting said buried collector region and extending from said second sidewall onto the top surface of said conductive collector contact layer;
    a monocystalline region on said face, electrically contacting said buried collector region in said opening and extending onto said third sidewall; and
    an intrinsic base region and an emitter region in said monocrystalline region.

2. The bipolar transistor of claim 1 in combination with a second active device in said semiconductor substrate adjacent said bipolar transistor, said semiconductor substrate being free of an isolation region between said bipolar transistor and said second active device.

3. The bipolar transistor of claim 1 wherein said monocrystalline region is of said first conductivity type.

4. The bipolar transistor of claim 3 wherein said intrinsic base region is of second conductivity type.

5. The bipolar transistor of claim 4 wherein said emitter region is of said first conductivity type and defines a P-N junction with said intrinsic base region.

6. The bipolar transistor of claim 1 further comprising a second opening in said second insulating layer, on said conductive collector contact layer, and a collector contact in said second opening, electrically contacting said conductive collector contact layer.

7. The bipolar transistor of claim 1 further comprising an extrinsic base region on said second insulating layer, electrically contacting said intrinsic base region.

8. The bipolar transistor of claim 1 wherein said monocrystalline region includes a top surface, opposite said face, and wherein said extrinsic base region is in said monocrystalline region and extends to the monocrystalline region top surface, said bipolar transistor further comprising a base contact on the monocrystalline region top surface, electrically contacting said extrinsic base region.

9. A bipolar transistor comprising:
    a semiconductor substrate having a first face;
    a first insulating region on said face, said first insulating region having a top surface opposite said face, an opening therethrough for exposing a portion of said semiconductor substrate and a first sidewall adjacent said opening, extending between said face and the top surface;
    an extrinsic collector region of first conductivity type in said substrate at said opening;
    a polycrystalline conductive collector contact region of said first conductivity type on said first sidewall and defining a second sidewall, electrically contacting said extrinsic collector region;

a monocrystalline region in said opening, said monocrystalline region comprising an intrinsic collector region of first conductivity type electrically contacting said extrinsic collector region;

a second insulating region disposed between said monocrystalline intrinsic collector region and said conductive collector contact region, extending along said second sidewall;

a monocrystalline intrinsic base region in said monocrystalline region, forming a P-N junction with said monocrystalline intrinsic collector region;

a monocrystalline emitter region in said monocrystalline region, forming a P-N junction with said monocrystalline intrinsic base region; and a monocrystalline extrinsic base region on said second insulating region, electrically connected to said monocrystalline intrinsic base region;

wherein said polycrystalline conductive collector contact region extends from said first sidewall onto the top surface of said first insulating region and includes a top surface, opposite the top surface of said first insulating region, and wherein said second insulating region extends from between said monocrystalline intrinsic collector region and said polycrystalline conductive collector contact region onto the top surface of said polycrystalline conductive collector contact region.

10. The bipolar transistor of claim 9, further comprising a base contact electrically connected to said extrinsic base region and a collector contact electrically connected to said polycrystalline conductive collector contact region.

* * * * *